United States Patent
Ge et al.

(10) Patent No.: US 9,889,659 B2
(45) Date of Patent: Feb. 13, 2018

(54) PRINTHEAD WITH A MEMRISTOR

(71) Applicant: HEWLETT-PACKARD DEVELOPMENT COMPANY, L.P., Houston, TX (US)

(72) Inventors: Ning Ge, Palo Alto, CA (US); Jianhua Yang, Palo Alto, CA (US); Minxian Zhang, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/328,277

(22) PCT Filed: Jul. 29, 2014

(86) PCT No.: PCT/US2014/048575
§ 371 (c)(1),
(2) Date: Jan. 23, 2017

(87) PCT Pub. No.: WO2016/018245
PCT Pub. Date: Feb. 4, 2016

(65) Prior Publication Data
US 2017/0217168 A1    Aug. 3, 2017

(51) Int. Cl.
| | | |
|---|---|---|
| *B41J 2/045* | (2006.01) | |
| *B41J 2/14* | (2006.01) | |
| *B41J 2/16* | (2006.01) | |
| *H01L 45/00* | (2006.01) | |
| *H01L 27/24* | (2006.01) | |

(52) U.S. Cl.
CPC ......... *B41J 2/1433* (2013.01); *B41J 2/04541* (2013.01); *B41J 2/04581* (2013.01); *B41J 2/1631* (2013.01); *H01L 27/2436* (2013.01); *H01L 27/2463* (2013.01); *H01L 45/1233* (2013.01); *B41J 2202/13* (2013.01)

(58) Field of Classification Search
CPC .. B41J 2/04541; B41J 2/0458; B41J 2/04581; B41J 2/04501; B41J 2/04548; B41J 2/0455; B41J 2202/13; G11C 13/00; G11C 13/0002; G11C 13/004; G11C 2013/0045
See application file for complete search history.

(56) References Cited

U.S. PATENT DOCUMENTS

| | | |
|---|---|---|
| 6,685,292 B2 | 2/2004 | Oshima |
| 6,789,865 B2 | 9/2004 | Suszuki et al. |
| 7,314,263 B2 | 1/2008 | Hayasaki et al. |
| 7,514,288 B2 | 4/2009 | Lung et al. |
| 7,543,908 B2 | 6/2009 | Benjamin et al. |

(Continued)

OTHER PUBLICATIONS

Mouttet, B., Proposals for Memristor Crossbar Design and Applications, Memristors and Memristive Systems Symposium, UC Berkeley Nov. 21, 2008, 59 pages.

*Primary Examiner* — Geoffrey Mruk
(74) *Attorney, Agent, or Firm* — Mannava & Kang, P.C.

(57) ABSTRACT

In an example, a printhead includes a memristor, in which the memristor may include a first electrode, a second electrode positioned in a crossed relationship with the first electrode to form a junction, and a switching element positioned at the junction between the first electrode and the second electrode, in which the switching layer includes a via formed in the switching element to reduce an area of the switching element.

18 Claims, 4 Drawing Sheets

(56) References Cited

U.S. PATENT DOCUMENTS

| | | | |
|---|---|---|---|
| 2013/0026434 A1* | 1/2013 | Yang | H01L 27/2472 |
| | | | 257/1 |
| 2013/0106930 A1 | 5/2013 | Lea et al. | |
| 2013/0175497 A1 | 7/2013 | Yang et al. | |
| 2014/0027700 A1* | 1/2014 | Nickel | H01L 45/08 |
| | | | 257/3 |
| 2014/0145142 A1 | 5/2014 | Zhang et al. | |
| 2014/0167042 A1 | 6/2014 | Yang et al. | |

* cited by examiner

PRINTHEAD WITH A MEMRISTOR

BACKGROUND

A memristor may generally be defined as an electrically actuated apparatus formed of a pair of spaced apart electrodes with a switching element positioned between the electrodes. Memristors are able to change the value of their resistances in response to various programming conditions and are able to exhibit a memory of past electrical conditions. For instance, memristors may be programmed to respectively represent a logical "1" or ON while in a low resistance state and a logical "0" or OFF while in a high resistance state and may retain these states. Particularly, the resistance state of the switching element may be changed through application of a current, in which the current may cause mobile dopants in the switching element to move, which may alter the electrical operation of the memristor. After removal of the current, the locations and characteristics of the dopants remain stable until the application of another programming electrical field. The state of the memristor may be read by applying a lower reading voltage across the switching element which allows the internal electrical resistance of the memristor to be sensed but does not generate a sufficiently high electrical field to cause significant dopant motion.

BRIEF DESCRIPTION OF THE DRAWINGS

Features of the present disclosure are illustrated by way of example and not limited in the following figure(s), in which like numerals indicate like elements, in which.

DETAILED DESCRIPTION

Figure 1:
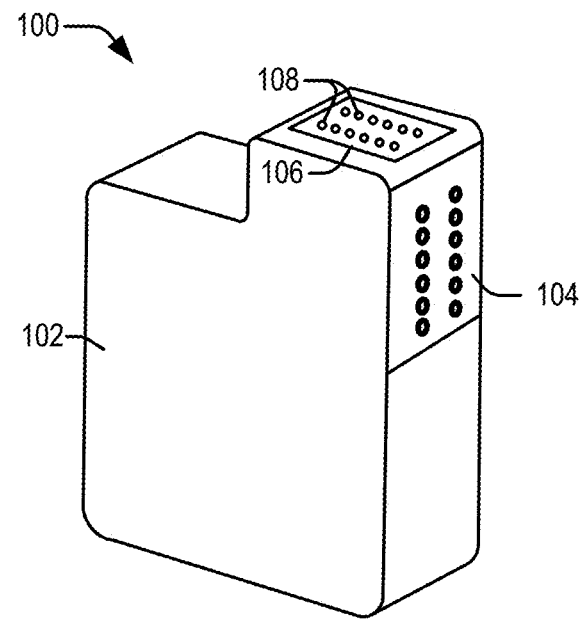
FIG. 1 shows a perspective view of a printhead apparatus, according to an example of the present disclosure.

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

Generally speaking, the overall current required to change the resistance state of a switching element in a memristor may have a relatively strong correlation to the size of the memristor. That is, the larger the memristor, and thus the switching element, the larger the current that is required to change the resistance state of the switching element. Relatively high current requirements may make it difficult to switch the switching element to the low resistance state because the memristor may have a relatively small resistance. This issue may be exacerbated when a conduction path in the switching element has certain parasitic resistance. In addition, the voltage divider effect may lead to small voltage drops across the memristor, which may lead to the memristor being stuck at the ON state.

The minimum size that the memristor, and thus the switching element, may have may be limited by the minimum technology critical dimension. The minimum technology critical dimension may be defined as the smallest dimension that may be attained using currently available fabrication techniques. In addition, or alternatively, the minimum technology critical dimension may be defined as the smallest dimension that may be attained using fabrication techniques that do not require a substantial capital investment to modify the fabrication techniques, such as by fabricating new tools. By way of particular example, the technology is lithography and the minimum size of the memristor may be about 2.6 μm × about 2.6 μm.

Disclosed herein is a printhead that includes a memristor, in which the memristor includes a switching element that has a via, in which the via enables the switching element to have an area that is smaller than the area attainable at the minimum technology critical dimension. In other words, the area of the memristor, and particularly, the area of the switching element, disclosed herein breaks through the minimum technology critical dimension area limit without requiring a substantial capital investment to increase the ability of lithographic techniques to further minimize the attainable size. As discussed in greater detail herein, the area of the switching element may be made to be smaller than the minimum technology critical dimension area limit through formation of the via in the switching element. The switching element may be formed to have dimensions that are relatively larger than the minimum technology critical dimension while the via may be formed to have dimensions at or around the minimum technology critical dimension limit. In this regard, both the switching element and the via may be formed in compliance with the minimum technology critical dimension, but the area of the switching element may be made to be smaller than the area attainable in compliance with the minimum technology critical dimension limit.

According to an example, a crossbar memory array may be formed with a plurality of the memristors disclosed herein. The crossbar memory array may be integrated in or on a printhead.

With reference first to FIG. 1, there is shown a perspective view of a cartridge 100, according to an example. It should be understood that the cartridge 100 depicted in FIG. 1 may include additional components and that some of the components described herein may be removed and/or modified without departing from a scope of the cartridge 100. It should also be understood that the cartridge 100 depicted in FIG. 1 may not be drawn to scale and thus, the cartridge 100 may have a different size and/or configuration other than as shown therein.

As shown in FIG. 1, the cartridge 100 includes a host 102 on which electrical contacts 104 and a printhead 106 are positioned. The cartridge 100 may house a fluid supply chamber that stores fluid, such as ink, for delivery onto a media through nozzles 108 in the printhead 106. Although not shown, actuating mechanisms may be positioned with respect to the nozzles 108 to cause the fluid to be ejected through the nozzles 108. The actuating mechanisms may be thermal resistors, piezoelectric actuators, etc. In addition, the electrical contacts 104 may carry electrical signals to and from a controller (not shown) to controllably actuate the actuating mechanisms and cause the fluid to be ejected through the nozzles 108 in a controlled manner. According to various examples, the cartridge 100 may be used in a printing system, such as a thermal inkjet printer, a piezoelectric printer, a facsimile machine, a multifunction machine, etc.

As discussed in greater detail herein a memory device (not shown) may be incorporated or integrated with the printhead 106, such as by being on-chip with the printhead 106. The memory device may be a non-volatile erasable programmable read only memory (EPROM), a non-volatile electrically erasable programmable read-only memory (EEPROM), or the like. In addition, the memory device may store information regarding the cartridge 100, such as information that may be used in authenticating the cartridge 100, information that may be used for marketing purposes, etc. By way of particular example, the memory device may store any of an identification number, part of a secret code, manufacturing information, etc.

The memory device may be communicatively connected to the electrical contacts 104 and a controller may access the information stored in the memory device through the electrical contacts 104. It should, however, be understood that the information contained in the memory device may be accessed in other manners, such as through a direct connection to the memory device, through a wireless communication mechanism (e.g., radio frequency identification), etc. In addition, although the memory device is depicted as being positioned on a particular section of the host 102, it should be understood that the memory device may be positioned at other locations with respect to the host 102, including within the host 102.

Figure 2:
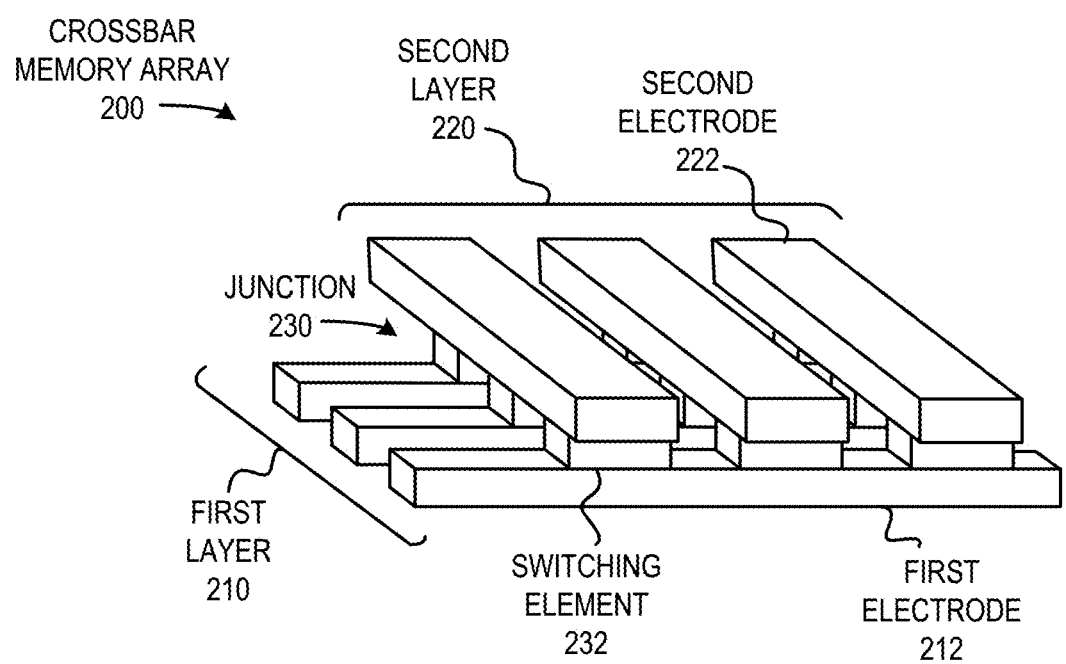
FIG. 2 shows a perspective view of a portion of a crossbar memory array, according to an example of the present disclosure.

As discussed in greater detail below, the memory device may include a crossbar memory array in which a plurality of memristors are formed at multiple junctions of the crossbar memory array. An example of a crossbar memory array 200 that the memory device may include is depicted in FIG. 2. Particularly, FIG. 2 depicts a perspective view of a portion of a crossbar memory array 200, according to an example. It should be understood that the crossbar memory array 200 depicted in FIG. 2 may include additional components and that some of the components described herein may be removed and/or modified without departing from a scope of the crossbar memory array 200. In other examples, the memory device may include a 1T1M structure instead of the crossbar structure depicted in FIG. 2.

As shown in FIG. 2, the crossbar memory array 200 includes a first layer 210 formed of a plurality of first electrodes 212 and a second layer 220 formed of a plurality of second electrodes 222. The first electrodes 212 are depicted as extending along a first plane and the second electrodes 222 are depicted as extending along a second plane, in which the second plane is parallel or nearly parallel to the first plane.

The first electrodes 212 and the second electrodes 222 are also depicted as being in a crossed relationship with respect to each other such that junctions 230 are formed at intersections between respective pairs of the first electrodes 212 and second electrodes 222. That is, the first electrodes 212 are depicted as extending in a direction that is perpendicular to the direction in which the second electrodes 222 extend. According to an example, the second electrodes 222 may be substantially perpendicular to the first electrodes 212, e.g., there may be less than about a 5° of rotation difference between the first electrodes 212 and the second electrodes 222.

The second electrodes 222 are further depicted as being in a spaced relationship with respect to the first electrodes 212 such that a gap exists between the first electrodes 212 and the second electrodes 222. In addition, switching elements 232 are depicted as being positioned at the junctions 230 at which the second electrodes 222 cross the first electrodes 212. The switching elements 232 and the sections of the first electrodes 212 and the second electrodes 222 around the switching elements 232 may form respective memristors. In addition, as discussed in greater detail below, a via may be formed in each of the switching elements to reduce an area of the switching element. Moreover, the via may be formed to extend through either or both of the first and second electrodes 212, 222.

The first electrodes 212 may be formed of an electrically conductive material, such as AlCu, AlCuSi, AlCuSi with a barrier layer, such as TiN, or the like. The second electrodes 222 may be formed of any of the example materials listed for the first electrodes 212. In addition, the second electrodes 222 may be formed of the same or different materials as compared with the first electrodes 212. The second electrodes 222 may be formed of an electrically conductive material, such as TaAl, WSiN, AlCu combination, or the like. The switching elements 232 may be formed of switching oxides, such as a metallic oxide. Specific examples of switching oxide materials may include magnesium oxide, titanium oxide, zirconium oxide, hafnium oxide, vanadium oxide, niobium oxide, tantalum oxide, chromium oxide, molybdenum oxide, tungsten oxide, manganese oxide, iron oxide, cobalt oxide, copper oxide, zinc oxide, aluminum oxide, gallium oxide, silicon oxide, germanium oxide, tin dioxide, bismuth oxide, nickel oxide, yttrium oxide, gadolinium oxide, and rhenium oxide, among other oxides. In addition to the binary oxides presented above, the switching oxides may be ternary and complex oxides such as silicon oxynitride. The oxides presented may be formed using any of a number of different processes such as sputtering from an oxide target, reactive sputtering from a metal target, atomic layer deposition (ALD), oxidizing a deposited metal or alloy layer, etc.

Turning now to FIG. 3A, there is shown a cross-sectional side view of a circuit component 300 including a memristor 310, according to an example. It should be understood that the circuit component 300 depicted in FIG. 3A may include additional components and that some of the components described herein may be removed and/or modified without departing from a scope of the circuit component 300.

The circuit component 300 may represent a junction 230 in the crossbar memory array 200 depicted in FIG. 2. FIG. 3A may thus depict one of the junctions 230 depicted in FIG. 2 along with other circuit elements. In this regard, each or a plurality of the junctions 230 in the crossbar memory array 200 may include the features depicted in the circuit component 300.

As shown in FIG. 3A, the circuit component 300 includes a memristor 310 having a first electrode 212, a second electrode 222, and a switching element 232. A via 312 is also depicted as extending through the first electrode 212, the switching element 232, and the second electrode 222. The via 312 may extend through a central portion of the switching element 232 as shown in FIG. 3B, which shows a top view of the memristor 310 with the second electrode 222 removed, according to an example. As shown in FIG. 3B, the via 312 may have a width L, in which the width L is a size that is equivalent to a technology critical dimension. That is, the width L may be equivalent to a minimum size that is attainable by a current technology, without requiring relatively expensive retooling. For instance, the technology critical dimension may be the smallest size attainable through current lithography processes, without requiring that a relatively large amount of money, e.g., millions of dollars, be spent to attain a smaller size.

In addition, the switching element 232 may have a width that is larger than the technology critical dimension. In FIG. 3B, the switching element 232 is depicted as having a width that is larger than the dimension L, i.e., the width of the switching element 232 is depicted as being a*L, which may be the same width for the switching element 232. According to an example, the value for the variable "a" may be a value that causes the effective area of the switching element 232 with the via to be less than the area L×L. In other words, through formation of the via 312 into the switching element 232, the area over which a current flows through the switching element 232 may be made to be smaller than is possible through conventional lithographic processes due to the technology critical dimension limitation. In addition, the variable "a" may have a sufficiently large value to enable the switching element 232 to have a sufficiently large area for the switching element 232 to switch from an "off" to an "on" state and for that information to be read from the switching element 232. By way of particular example, "a" may be equal to a value that is between approximately 1.2 and approximately 1.4.

According to an example, the first electrode 212, the second electrode 222, and the switching element 232 may each have a width equal to a×L to substantially minimize the size the of the memristor 310, while also enabling for the formation of the via 312 having the width L. However, the first electrode 212 and the second electrode 222 may have lengths that are substantially larger than a×L, for instance, to form a crossbar memory array 200.

According to a further example, the via 312 may be filled with a dielectric material 314, such as silicon dioxide, silicon nitride, silicon carbide, SiC with SiN, or the like.

With reference back to FIG. 3A, the circuit component 300 may also include additional components including transistors and resistors to enable the memristor 310 to be electrically addressed and programmed. For instance, the circuit component 300 may include a substrate 320, which may be doped to be a p-type semiconductor, semiconductors 322 and 324, which may be doped to be n-type semiconductors, and a poly 326. The circuit component 300 may also include a glass layer 328, which may be formed of, for instance, phosphosilicate glass (PSG), borophosphosilicate glass (BPSG), undoped silicate glass (USG), or the like. The circuit component 300 may further include a tetraethyl orthosilicate (TEOS) layer 330 and a passivation layer 332. The TEOS layer 330 may serve as an inter-layer dielectric layer between the first electrode 212 and the second electrode 222 for electrical isolation. In addition, the TEOS layer 330 may provide planarization functions to mitigate topography differences. The passivation layer 332 may be formed of silicon carbide (SiC), silicon nitride (SiN), or the like.

Although the switching element 232 is depicted in the figures as being in direct contact with the first electrode 212 and the second electrode 222, in other examples, an additional layer or additional layers may be provided between the switching element 232 and either or both of the first electrode 212 and the second electrode 222. The additional layer(s) may be provided to enhance switching characteristics and/or operation of the memristor 310 and may be, for instance, TiN, TaN, or the like. In any regard, the via 312 may extend through the additional layer(s).

Figure 4:
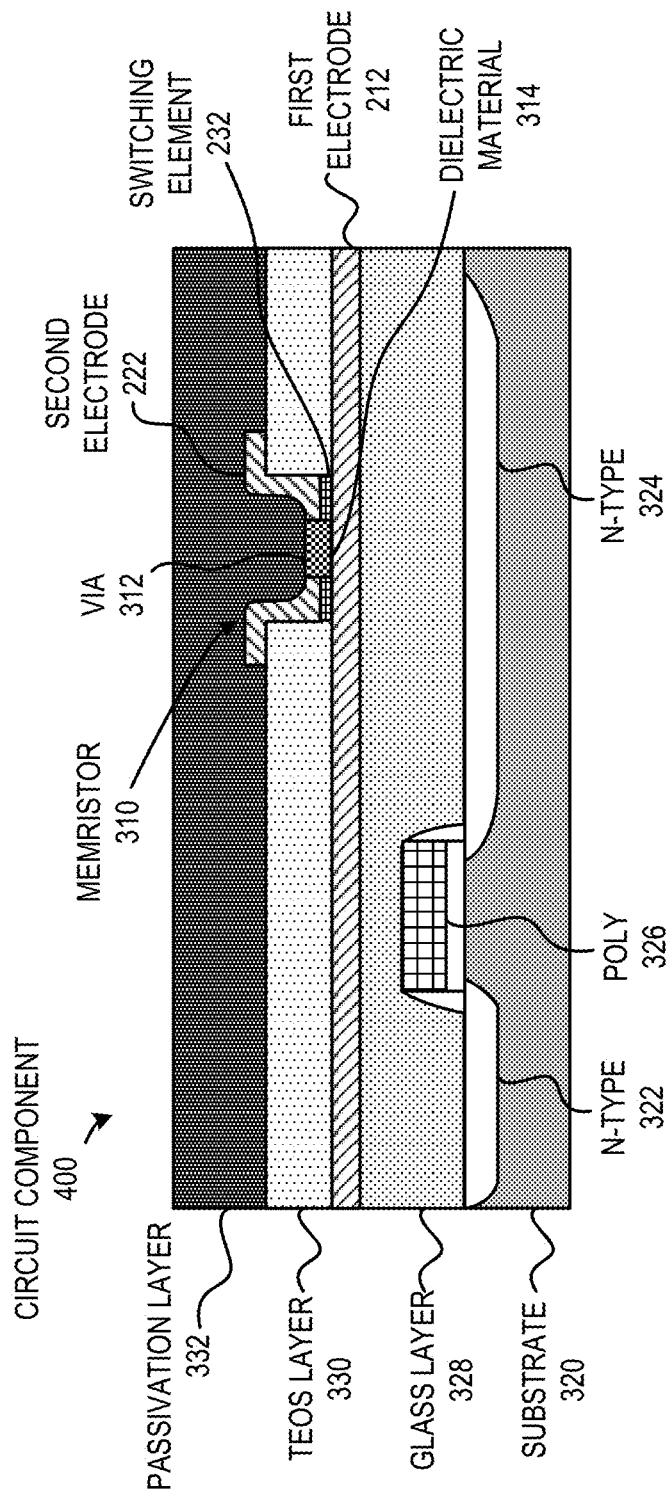
FIG. 4 shows a cross-sectional side view of a circuit component including a memristor, according to another example of the present disclosure.

With reference now to FIG. 4, there is shown a cross-sectional side view of a circuit component 400 including a memristor 410, according to another example. It should be understood that the circuit component 400 depicted in FIG. 4 may include additional components and that some of the components described herein may be removed and/or modified without departing from a scope of the circuit component 400.

Figure 3:
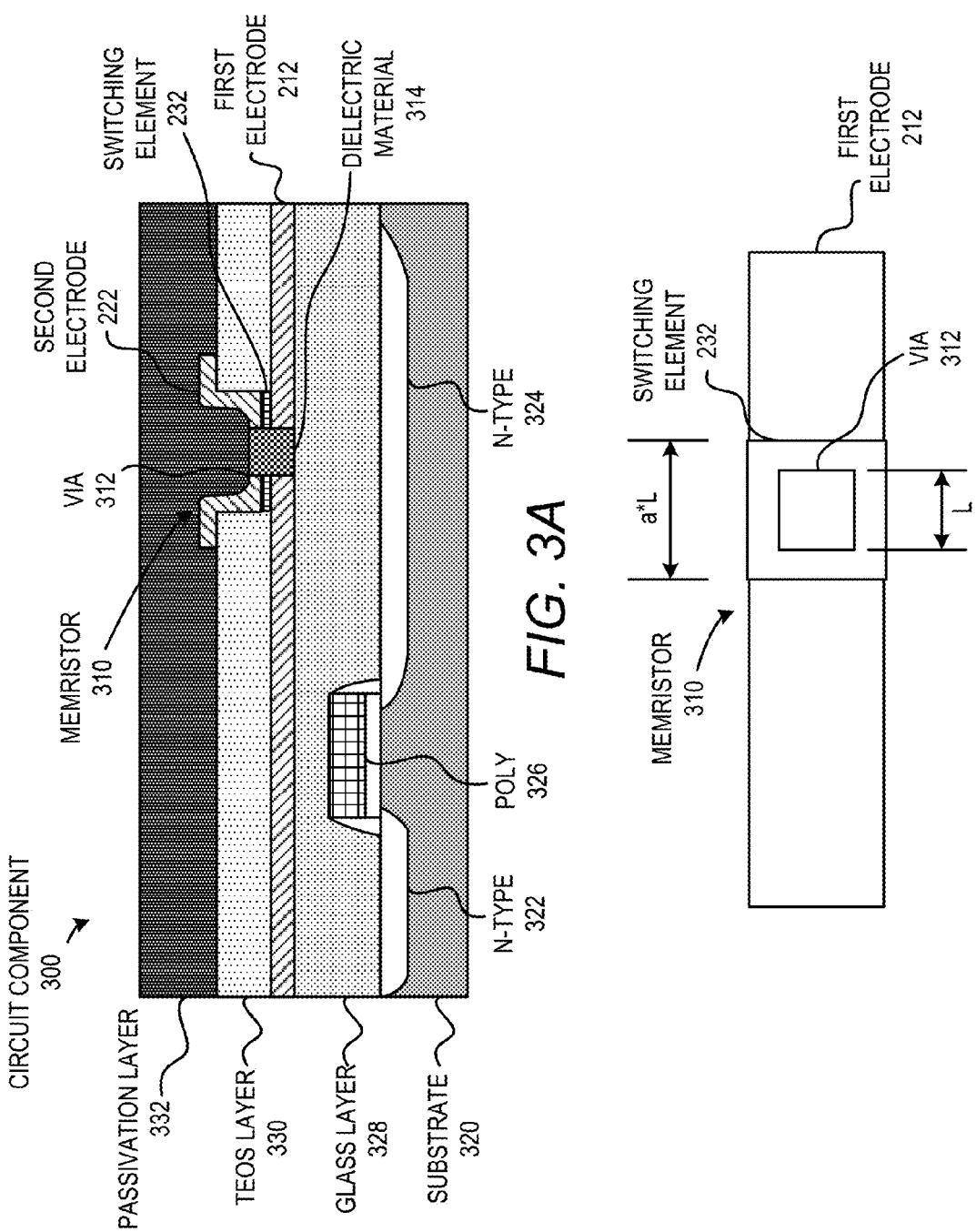
FIG. 3A shows a cross-sectional side view of a circuit component including a memristor, according to an example of the present disclosure.
FIG. 3B shows a top view of the memristor depicted in FIG. 3A, with the second electrode removed, according to an example of the present disclosure.

The circuit component 400 depicted in FIG. 4 includes all of the same elements as those depicted in the circuit component 300 depicted in FIG. 3A. The circuit component 400 differs from the circuit component 300 depicted in FIG. 3 in that the via 312 extends through the second electrode 222 and the switching element 232 without extending through the first electrode 212.

Figure 5:
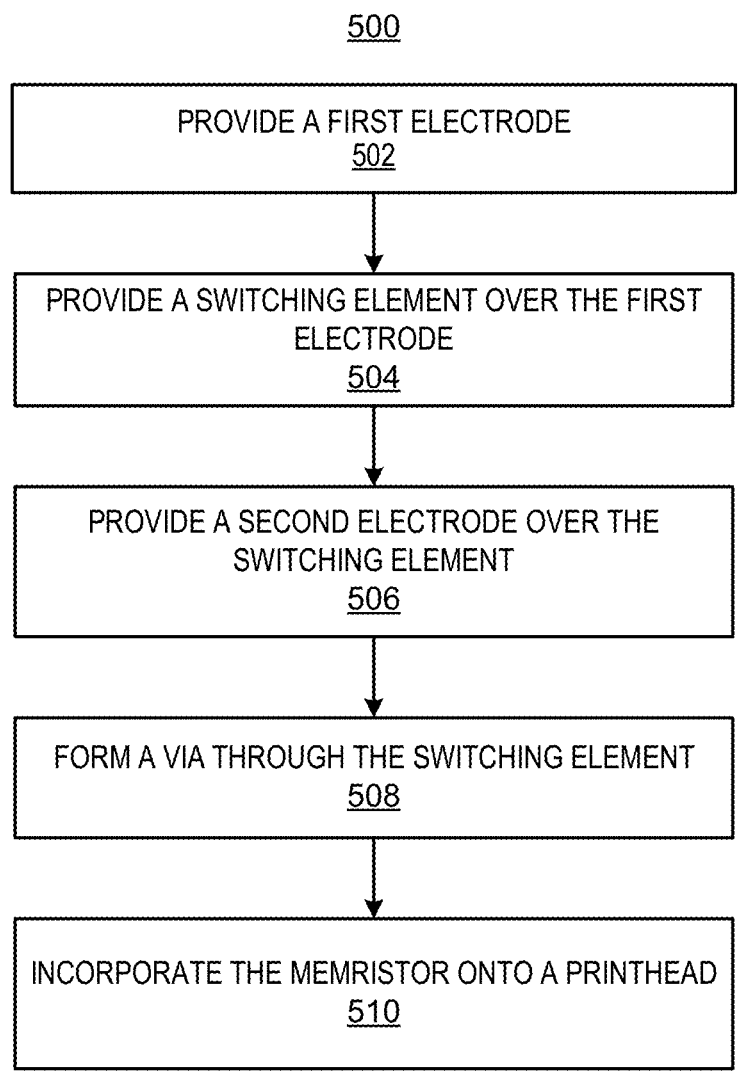
FIG. 5 shows a flow diagram of a method for fabricating a printhead, according to an example of the present disclosure.

Turning now to FIG. 5, there is shown a flow diagram of a method 500 for fabricating a printhead 106, according to an example. It should be understood that the method 500 depicted in FIG. 5 may include additional operations and that some of the operations described herein may be removed and/or modified without departing from a scope of the method 500. Although the method 500 describes a process in which printhead including a memristor 310, 410 is fabricated, with particular discussion of the memristor fabrication, it should be understood that the memristor 410 may be fabricated along with the other components of the circuit component 300, 400 as shown in FIGS. 3A and 4A. Thus, for instance, the other components of the circuit components 300, 400 may be fabricated before, during, and/or after the processes discussed below with respect to the method 500. In addition, the method 500 may be repeated as desired or needed to form a crossbar memory array 200 composed of multiple memristors 310, 410 on or in the printhead 106.

At block 502, a first electrode 212 may be provided. The first electrode 212 may be provided, e.g., formed, through any suitable formation process, such as, chemical vapor deposition, sputtering, etching, lithography, etc. As discussed above, the first electrode 212 may be formed of an electrically conductive material such as AlCu, AlCuSi, AlCuSi with a barrier layer, such as TiN, or the like.

At block 504, a switching element 232 may be provided over the first electrode 212. The switching element 232 may be provided, e.g., formed, through any suitable formation process, such as, through sputtering, pulse laser deposition, atomic layer deposition, etc. As discussed above, the switching element 232 may be provided through use of sputtering from an oxide target, reactive sputtering from a metal target, atomic layer deposition (ALD), oxidizing a deposited metal or alloy layer, etc. As also discussed above, the switching element 232 may be formed to have dimensions that are larger than a lithography minimum technology critical dimension. Likewise, the first electrode 212 and the second electrode 222 may also have widths that are larger than the lithography minimum technology critical dimension.

At block 506, a second electrode 222 may be provided over the switching element 232. The second electrode 222 may be provided, e.g., formed, through a formation process, such as E-beam evaporation, chemical vapor deposition, sputtering, atomic layer deposition, etching, (imprint) lithography, etc. Following block 508, a memristor 310, 410 may be formed.

At block 508, a via 312 may be formed through the second electrode 222 and the switching element 232. The via 312 may be formed through any suitable combined process of lithography and etching processes, including dry etching and wet etching. As discussed above, the size of the via 312 may be limited by the lithographic technology critical dimension. As such, the via 312 may be formed to have dimensions that are substantially equal to the lithography minimum technology critical dimension. For instance, the via 312 may be formed to have dimensions that are equal to the lithography minimum technology critical dimension or less than about 10% of the lithography minimum technology critical dimension.

At block 510, the memristor 310, 410 may be incorporated onto a printhead 106. The memristor 310, 410 may be incorporated onto the printhead 106 in any of the manners discussed above with respect to FIG. 1. For instance, a plurality of memristors 310, 410 may be formed into an array, such as the crossbar memory array 200 depicted in FIG. 2, and the array may be incorporated into a memory device, which is integrated onto the printhead 106. According to an example, block 510 may be omitted, for instance, when the memristor 310, 410 is formed directly on or with the printhead 106.

According to an example, instead of forming the via 312 through only the second electrode 222 and the switching element 232 at block 508, the via 312 may also be formed through the first electrode 212, as shown in FIG. 3A. In this example, at block 508, the via 312 may be formed through the second electrode 222, the switching element 232, and the first electrode 212.

According to another example, the via 312 may be filled with a dielectric layer 314, for instance, to prevent undesired particles from being deposited into the via 312.

What has been described and illustrated herein are examples of the disclosure along with some variations. The terms, descriptions and figures used herein are set forth by way of illustration only and are not meant as limitations. Many variations are possible within the scope of the disclosure, which is intended to be defined by the following claims—and their equivalents—in which all terms are meant in their broadest reasonable sense unless otherwise indicated.

What is claimed is:

1. A printhead comprising:
   a memristor including:
      a first electrode;
      a second electrode positioned in a crossed relationship with the first electrode to form a junction;
      a switching element positioned at the junction between the first electrode and the second electrode; and
      a via formed in the switching element to reduce an area of the switching element, wherein the via includes a first material different from a second material of the switching element.

2. The printhead according to claim 1, wherein the via further extends through the second electrode.

3. The printhead according to claim 1, wherein the first electrode has a first width, the second electrode has a second width, and wherein the first width and the second width is larger than a lithography minimum technology critical dimension.

4. The printhead according to claim 3, wherein the switching element has a switching element width that is larger than the lithography minimum technology critical dimension, and wherein the via has a via width that is equal to or substantially equal to the lithography minimum technology critical dimension.

5. The printhead according to claim 4, wherein the switching element width is between approximately 1.2 and approximately 1.4 times larger than the via width.

6. The printhead according to claim 4, wherein the area of the switching element with the via is smaller than an area attainable for the switching element without the via through lithography.

7. The printhead according to claim 1, wherein the via is filled with the first material, the first material comprising a dielectric material.

8. The printhead according to claim 7, wherein the second material of the switching element comprises a switching oxide.

9. The printhead according to claim 8, wherein the switching oxide comprises a metal oxide.

10. The printhead according to claim 7, wherein the dielectric material comprises a material selected from the group consisting of silicon dioxide, silicon nitride, and silicon carbide.

11. A method of fabricating a printhead, the method comprising:
    incorporating a memristor onto the printhead by:
       providing a first electrode;
       providing a switching element over the first electrode;
       providing a second electrode over the switching element to form the memristor; and
       forming a via through the second electrode and the switching element to reduce an effective area of the switching element, wherein the via includes a first material different from a second material of the switching element.

12. The method according to claim 11, wherein forming the via further comprises forming the via to have a width that is equal to or substantially equal to a lithography minimum technology critical dimension.

13. The method according to claim 12, wherein providing the switching element further comprises forming the switching element through a lithographic process to have a width that is between approximately 1.2 and approximately 1.4 times larger than the width of the via.

14. The method according to claim 12, further comprising:
    filling the via with the first material, the first material comprising a dielectric material.

15. The method according to claim 11, further comprising:
    incorporating an array of the memristors onto the printhead.

16. A cartridge comprising:
    a printhead; and
    a crossbar memory array comprising a plurality of memristors, each of the plurality of memristors including:
       a first electrode;
       a second electrode positioned in a crossed relationship with the first electrode to form a junction; and
       a switching element positioned at the junction between the first electrode and the second electrode, wherein a via extends through the second electrode and the switching element to reduce an area of the switching element, wherein the via includes a first material different from a second material of the switching element.

17. The cartridge according to claim 16, wherein the crossbar memory array is integrated with the printhead, wherein the first electrode has a first width, the second electrode has a second width, and wherein the first width and the second width are larger than a lithography minimum technology critical dimension.

18. The cartridge according to claim 17, wherein the switching element has a switching element width that is larger than the lithography minimum technology critical dimension, and wherein the via has a via width that is equal to or substantially equal to the lithography minimum technology critical dimension.

* * * * *